US008112270B2

(12) United States Patent
Nakatsuyama

(10) Patent No.: US 8,112,270 B2
(45) Date of Patent: *Feb. 7, 2012

(54) DIGITAL RECORDING AND PLAYBACK SYSTEM WITH VOICE RECOGNITION CAPABILITY FOR CONCURRENT TEXT GENERATION

(75) Inventor: Takashi Nakatsuyama, LaJolla, CA (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 298 days.

This patent is subject to a terminal disclaimer.

(21) Appl. No.: 11/973,720

(22) Filed: Oct. 9, 2007

(65) Prior Publication Data

US 2008/0040106 A1 Feb. 14, 2008

Related U.S. Application Data

(63) Continuation of application No. 10/796,474, filed on Mar. 8, 2004, now Pat. No. 7,295,969, which is a continuation of application No. 09/439,380, filed on Nov. 15, 1999, now Pat. No. 6,754,619.

(51) Int. Cl.
*G10L 19/00* (2006.01)
*G10L 15/00* (2006.01)
*G10L 21/00* (2006.01)
(52) U.S. Cl. ......... 704/201; 704/231; 704/235; 704/270
(58) Field of Classification Search .................. 704/235, 704/201, 231, 270
See application file for complete search history.

(56) References Cited

U.S. PATENT DOCUMENTS

| 4,550,425 | A | * | 10/1985 | Andersen et al. ............. 704/212 |
| 4,717,261 | A | | 1/1988 | Kita et al. |
| 4,935,954 | A | | 6/1990 | Thompson et al. |
| 4,975,957 | A | | 12/1990 | Ichikawa et al. |
| 5,031,113 | A | | 7/1991 | Hollerbauer |
| 5,197,052 | A | | 3/1993 | Schroder et al. |
| 5,438,630 | A | | 8/1995 | Chen et al. |
| 5,465,240 | A | * | 11/1995 | Mankovitz ........................ 369/1 |
| 5,477,511 | A | | 12/1995 | Englehardt |
| 5,495,553 | A | | 2/1996 | Jakatdar |
| 5,526,259 | A | * | 6/1996 | Kaji .................................. 704/3 |
| 5,621,538 | A | * | 4/1997 | Gnant et al. .................. 386/207 |
| 5,649,060 | A | | 7/1997 | Ellozy et al. |
| 5,680,506 | A | * | 10/1997 | Kroon et al. .................. 704/203 |
| 5,724,410 | A | | 3/1998 | Parvulescu et al. |
| 5,739,850 | A | | 4/1998 | Hori |
| 5,754,978 | A | | 5/1998 | Perez-Mendez et al. |
| 5,799,273 | A | * | 8/1998 | Mitchell et al. ............... 704/235 |
| 5,809,464 | A | | 9/1998 | Kopp et al. |

(Continued)

FOREIGN PATENT DOCUMENTS

CA 2227371 A1 8/1998

(Continued)

*Primary Examiner* — James S. Wozniak
*Assistant Examiner* — Matthew Baker

(57) ABSTRACT

A recording and playback system is provided. The system includes an audio capturing device configured to receive an analog input and an encoder coupled to the audio capturing device configured to generate a digital signal based on the analog input. The system further includes a recognition engine coupled to the audio capturing device and configured to generate text data based on the analog input, wherein the encoder and the recognition engine simultaneously generate the digital signal and the text data such that the digital signal and the text data can be provided in a synchronized manner.

22 Claims, 4 Drawing Sheets

U.S. PATENT DOCUMENTS

| | | | |
|---|---|---|---|
| 5,815,196 A | | 9/1998 | Ashawi |
| 5,826,102 A | * | 10/1998 | Escobar et al. ............... 715/202 |
| 5,832,171 A | * | 11/1998 | Heist ............................ 386/241 |
| 5,857,099 A | | 1/1999 | Mitchell et al. |
| 5,960,447 A | * | 9/1999 | Holt et al. .................... 715/201 |
| 5,995,936 A | | 11/1999 | Brais et al. |
| 6,138,096 A | | 10/2000 | Chan et al. |
| 6,151,576 A | | 11/2000 | Warnock et al. |
| 6,154,207 A | * | 11/2000 | Farris et al. .................. 715/210 |
| 6,226,361 B1 | * | 5/2001 | Koyama ..................... 379/88.07 |
| 6,308,158 B1 | | 10/2001 | Kuhnen et al. |
| 6,335,768 B1 | * | 1/2002 | Reinold et al. ................ 348/723 |
| 6,754,619 B1 | * | 6/2004 | Nakatsuyama ............... 704/201 |
| 7,346,042 B2 | * | 3/2008 | Horiguchi et al. ............ 370/352 |

FOREIGN PATENT DOCUMENTS

| | | |
|---|---|---|
| EP | 0780777 A1 | 6/1997 |
| JP | 10285272 | 10/1998 |
| WO | 9733220 | 9/1997 |

\* cited by examiner

DIGITAL RECORDING AND PLAYBACK SYSTEM WITH VOICE RECOGNITION CAPABILITY FOR CONCURRENT TEXT GENERATION

RELATED APPLICATIONS

The present application is a continuation application of and claims the benefit of U.S. patent application Ser. No. 10/796,474, filed Mar. 8, 2004 now U.S. Pat. No. 7,295,969, entitled "DIGITAL RECORDING AND PLAYBACK SYSTEM WITH VOICE RECOGNITION CAPABILITY FOR CONCURRENT TEXT GENERATION," naming Takashi Nakatsuyama as the inventor, assigned to the assignee of the present invention, which is a continuation application of application Ser. No. 09/439,380 now U.S. Pat. No. 6,754,619, filed on Nov. 15, 1999, entitled "DIGITAL RECORDING AND PLAYBACK SYSTEM WITH VOICE RECOGNITION CAPABILITY FOR CONCURRENT TEXT GENERATION," naming Takashi Nakatsuyama as the inventor, assigned to the assignee of the present invention. Both of these applications are incorporated herein by reference in their entirety and for all purposes.

BACKGROUND OF THE INVENTION

1. Field of the Invention

The present invention relates to the design of digital recording and playback systems. More specifically, the present invention pertains to the processing of voice and concurrent generation of corresponding text in a portable digital appliance.

2. Related Art

The use of portable digital recording and playback devices are quickly gaining popularity in business and among individual users. In particular, one attractive feature of digital recording is the possibility of converting the voice messages into text, which can then be reviewed, revised and incorporated into documents or otherwise retrieved for use subsequently. Today, there are several models of portable digital recorder in the marketplace. These prior art recorders typically record voice messages as compressed digital data. In order to convert the compressed digital data to text data, a separate computer program is generally required. Thus, in the prior art, subsequent to a recording session, the user needs to post-process the compressed digital data to perform the voice-to-text conversion. This requires additional processing time, and in some cases even requires the user to transfer the compressed digital data from the portable device to a personal computer (PC) having the necessary software program before the conversion can be performed. It is desirable to eliminate the extra step of post-recording conversion from compressed digital data to text data in a portable digital recording and playback system.

These prior art devices are not well-suited for generating text data from the recorded voice data for an additional reason. In order to achieve good conversion from voice to text, a high quality voice input to the voice to text conversion engine is needed. In prior art portable systems, the voice data is subject to high compression because portable systems typically have limited memory capacity, and high compression allows more voice data to be stored into the limited memory resources. Since voice data is stored in a highly compressed format in these portable prior art devices, the text data generated directly from the compressed voice data by a conversion program is usually unsatisfactory. As such, it is highly advantageous to have a portable digital recording and playback system which provides high quality conversion from voice to text.

Furthermore, portable devices are typically battery-powered. Thus, the need to conserve power is a major design consideration. As such, while a high capacity stager can potentially be used in a large, non-portable device deriving its power from a power outlet to improve the quality of the conversion from compressed voice data to text data, it is not a viable option in a portable device. Therefore, there exists a need for a portable digital recording and playback system which provides high quality conversion from voice to text and yet does not require a high rate of power consumption.

SUMMARY OF THE INVENTION

In implementing a viable portable digital recording and playback system, it is highly desirable that components that are well known in the art and are compatible with existing computer systems and other appliances be used so that the cost of realizing the portable digital recording and playback system is low. By so doing, the need to incur costly expenditures for retrofitting existing computer systems and other appliances or for building custom components is advantageously eliminated.

Thus, a need exists for a portable digital recording and playback system which does not require post-recording conversion to generate text data from compressed digital data. A further need exists for a portable digital recording and playback system which meets the above need and which provides high quality conversion from voice to text. Still another need exists for a portable digital recording and playback system which meets both of the above needs and which does not require a high level of power consumption. Yet another need exists for a portable digital recording and playback system which meets all of the above needs and which is conducive to use with existing computer systems and other appliances.

Accordingly, the present invention provides a portable digital recording and playback system which generates text data from voice without requiring post-recording conversion from compressed digital data to text data. The present invention further provides a portable digital recording and playback system which not only provides voice to text conversion without post-processing but the conversion is also of high quality. Embodiments of the present invention perform voice-to-text conversion using the high quality audio input signal rather than highly compressed voice data so that high quality conversion is achieved. Moreover, the present invention provides a portable digital recording and playback system which includes the above features and which conserves power for full battery operation. Furthermore, embodiments of the present invention utilize components that are well known in the art and are compatible with existing computer systems and other appliances, so that the present invention is conducive for use with existing computer systems and other appliances. These and other advantages of the present invention not specifically mentioned above will become clear within discussions of the present invention presented herein.

More specifically, in one embodiment of the present invention, a digital recording and playback system is provided. In this embodiment, the system comprises an audio capturing device configured to receive a voice input. The system also comprises a high compression encoder (HCE) coupled to the audio capturing device and configured to generate digital wave data corresponding to the voice input. The system further comprises a voice recognition engine (VRE) coupled to the audio capturing device and configured to generate text data corresponding to the voice input. Moreover, in this embodiment, the HCE and VRE are selectively coupled to a memory sub-system which is configured to store the digital wave data and the text data. In particular, in this embodiment, the HCE and the VRE are operable to concurrently generate the digital wave data and the text data in response to the voice input such that the digital wave data and the text data can be stored in the memory sub-system in a synchronized manner. Thus, in this embodiment, the present invention provides recording capability wherein text data is generated from a voice input without requiring post-recording conversion. In a specific embodiment, the present invention includes the above and wherein the system is battery-powered.

Additional embodiments of the present invention include the above and further comprise a decoder selectively coupled to the memory sub-system and configured to decode the digital wave data into decoded audio data, a digital-to-analog (D/A) converter coupled to the decoder and configured to convert the decoded audio data into an analog signal, and an audio output device coupled to the D/A converter and configured to generate a voice output corresponding to the voice input from the analog signal. Moreover, these embodiments also comprises a display sub-system selectively coupled to the memory sub-system and configured to display the text data. Thus, in these embodiments, the present invention provides simultaneous voice playback and text display.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

In the following detailed description of the present invention, a digital recording and playback system with voice recognition capability for concurrent text generation, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Figure 1:
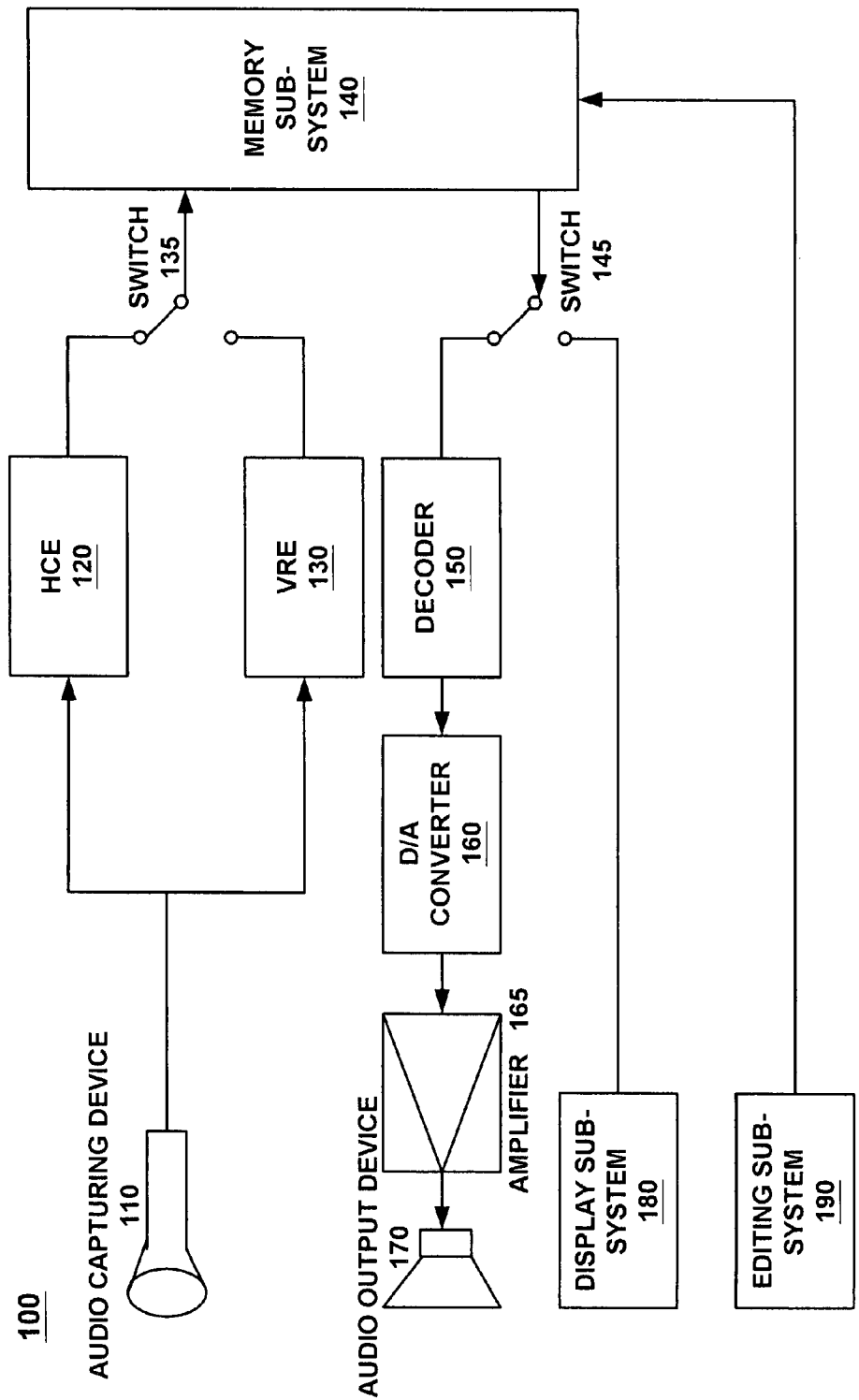
FIG. 1 is a block diagram illustrating a portable digital recording and playback system 100 in accordance with one embodiment of the present invention, wherein the system has built-in voice recognition capability for concurrent text generation during voice recording.

Exemplary Configuration of a Digital Recording and Playback System of the Present Invention FIG. 1 is a block diagram illustrating a portable digital recording and playback system 100 in accordance with one embodiment of the present invention, wherein the system has built-in voice recognition capability for concurrent text generation during voice recording. In system 100, an audio capturing device 110 is coupled to a high compression encoder (HCE) 120. Audio capturing device 110 is also coupled to a voice recognition engine (VRE) 130. Both HCE 120 and VRE 130 are selectively coupled to a memory sub-system 140 through an intelligent switch 135. More particularly, switch 135 is operable to couple either HCE 120 or VRE 130, but not both, to memory sub-system 140 at any given time. In one embodiment, switch 135 is a multiplexer. In another embodiment, switch 135 is a software switch for data routing. In an exemplary embodiment, audio capturing device 110 comprises a microphone. It is appreciated that audio signals are supplied to HCE 120 and VRE 130 simultaneously so that voice encoding and recognition functions can be performed in parallel.

It is appreciated that within the scope of the present invention, memory sub-system 140 can comprise volatile memory (e.g., random access memory RAM), non-volatile memory (e.g., read only memory ROM), and/or data storage devices such as magnetic or optical disk drives and disks (e.g., diskettes, tapes, cartridges) which are computer readable media for storing information and instructions. These memory modules of memory sub-system 140 can be removable to facilitate the easy transfer of data stored therein. In one embodiment, memory sub-system 140 comprises semiconductor flash memory.

Still referring to FIG. 1, memory sub-system 140 is selectively coupled to both a decoder 150 and a display sub-system 180 through an intelligent switch 145. More particularly, switch 145 is operable to couple memory sub-system 140 to either decoder 150 or display sub-system 180, but not both, at any given time. In one embodiment, switch 145 is a multiplexer. In another embodiment, switch 145 is a software switch. In one embodiment, switch 145 is controlled by the texted voice data generated by VRE 130. Moreover, in an exemplary embodiment, display sub-system 180 comprises flat panel display technology, for example, a liquid crystal display (LCD).

With reference still to FIG. 1, decoder 150 is further coupled to a digital-to-analog (D/A) converter 160. Moreover, D/A converter 160 is coupled to an amplifier 165, which is in turn coupled to an audio output device 170. In one embodiment, audio output device 170 comprises a speaker.

With reference still to FIG. 1, in one embodiment, an editing sub-system 190 is coupled to memory sub-system 140. In this embodiment, editing sub-system 190 can include an alphanumeric input device having alphanumeric and function keys to allow user editing of the text data. Editing sub-system 190 can also include a cursor control or directing device to facilitate text editing and command selection by a user. Cursor control device allows the computer user to dynamically signal the two dimensional movement of a visible symbol (cursor) on a screen of display sub-system 180. Many implementations of cursor control device are known in the art including a trackball, mouse, touch pad, joystick or special keys on the alphanumeric input device capable of signaling movement of a given direction or manner of displacement. Alternatively, it will be appreciated that a cursor can be directed and/or activated via input from the alphanumeric input device using special keys and key sequence commands. The present invention is also well suited to directing a cursor by other means such as, for example, voice commands.

Moreover, editing sub-system 190 can further include a printing device for generating paper copies of the text data.

Operation of a Digital Recording and Playback System of the Present Invention

Figure 2A:
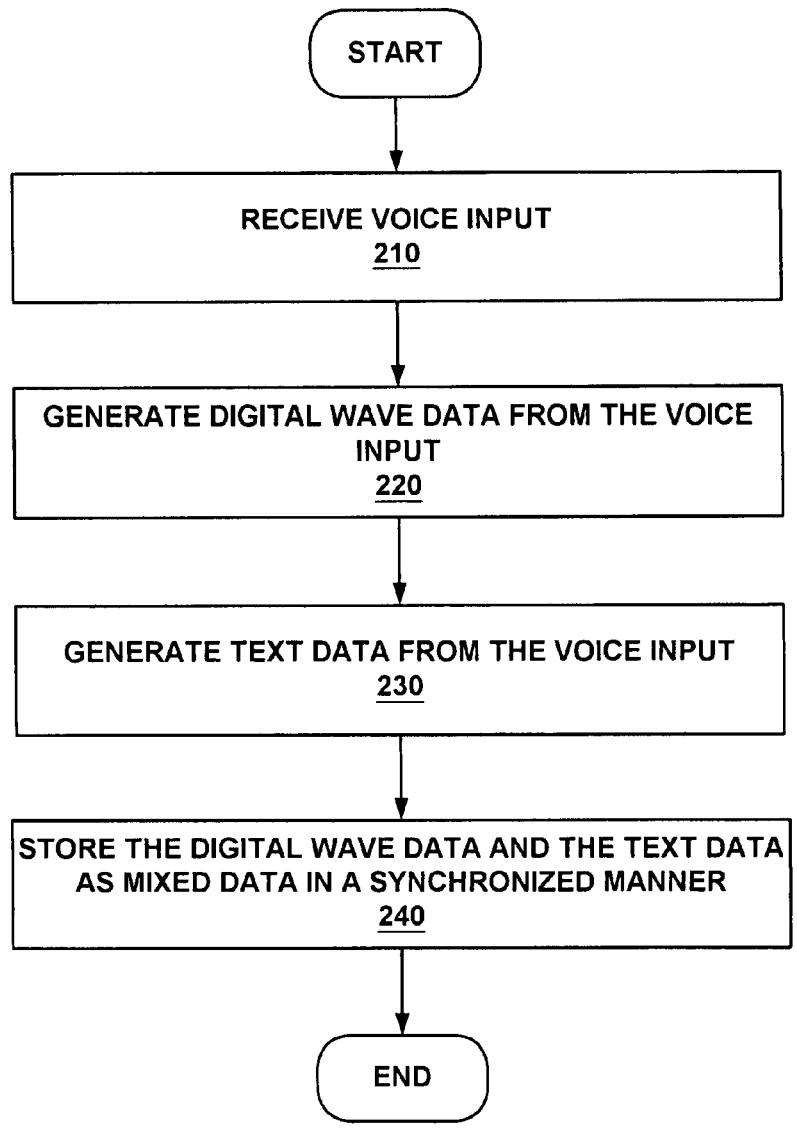
FIG. 2A is a flow diagram illustrating steps for performing recording using system 100 of FIG. 1 in accordance with one embodiment of the present invention.

Referring next to FIG. 2A, a flow diagram 200 illustrating steps for performing recording using system 100 of FIG. 1 in accordance with one embodiment of the present invention is shown. In step 210, system 100 receives a voice input using audio capturing device 110.

In step 220, system 100 of FIG. 1 generates digital wave data from the voice input using HCE 120. In an exemplary embodiment, HCE 120 of system 100 can achieve a compression rate of two kilobits per second (2 kbit/s). It is appreciated that the high level of compression of the digital wave data in accordance with the present invention advantageously reduces the amount of memory that is required to store the digital wave data.

In step 230, system 100 of FIG. 1 generates text data from the voice input using VRE 130. In one embodiment, VRE 130 of system 100 uses Hidden Markov Model (HMM) techniques to perform voice recognition, although other voice recognition techniques can also be used within the scope of the present invention. It is also appreciated that the text data can be in any of a wide variety of formats. In an exemplary embodiment, the text data is generated in hypertext markup language (HTML) format.

Referring still to FIG. 2A, in step 240, system 100 of FIG. 1 stores the digital wave data and the text data as mixed data in memory sub-system 140 in a synchronized manner. More specifically, in one embodiment, steps 220 and 230 are performed concurrently and the digital wave data and the text data generated is sent to memory sub-system 140 via switch 135 in alternate fashion such that a particular portion of the digital wave data is correlated with the corresponding portion of the text data as they are being stored as mixed data. In an exemplary embodiment, the present invention employs a buffering mechanism in conjunction with switch 135 to handle timing delays that may arise during the voice recognition process (e.g., digital wave data is generated more quickly by HCE 120 than the corresponding text data is generated by VRE 130) to ensure that corresponding portions of digital wave data and text data is synchronized when it is stored in memory sub-system 140.

Figure 2B:
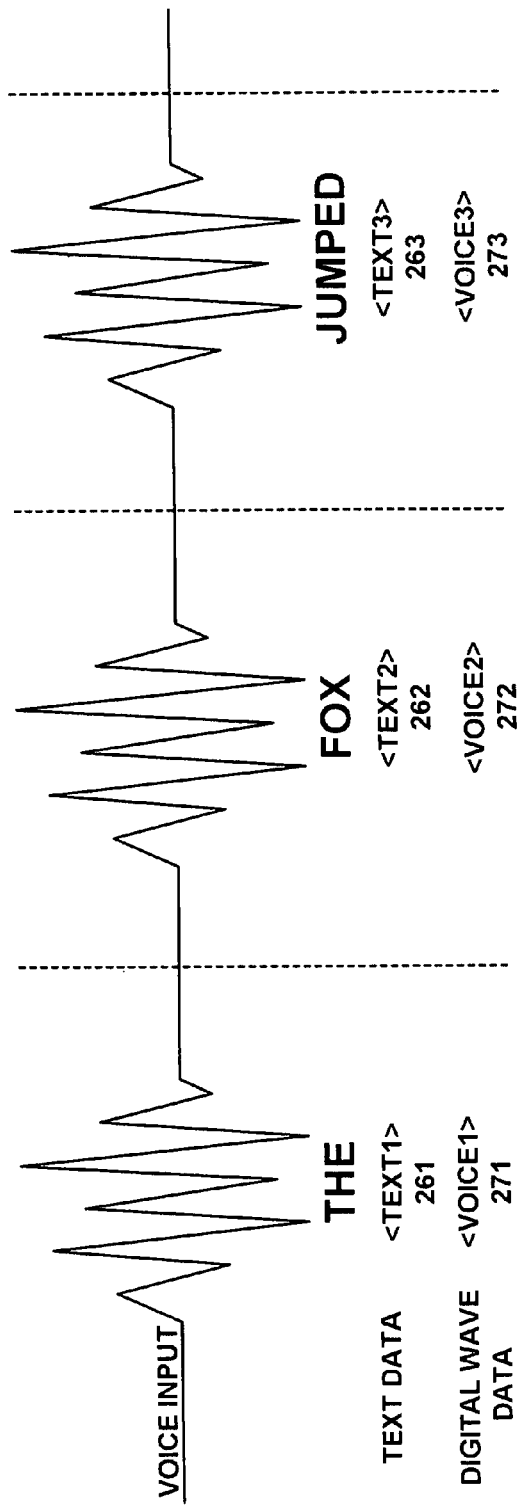
FIG. 2B is a diagram illustrating one embodiment of arrangement of corresponding portions of voice data and text data as stored in a portable digital recording and playback system 100 in accordance with the present invention.

Referring next to FIG. 2B, a diagram illustrating one embodiment of arrangement of corresponding portions of voice data and text data as stored in a portable digital recording and playback system 100 in accordance with the present invention is shown. In an exemplary embodiment as shown in FIG. 2B, a voice input is converted into portions 261, 262 and 263 of digital wave data and corresponding portions 271, 272 and 273 of text data. These portions of digital wave data and text data are then stored in memory sub-system 140 as mixed data such that respective portions of digital wave data and text data are synchronized. More specifically, in one embodiment, the data portions are stored in alternate fashion such that a particular portion of the digital wave data is correlated with the corresponding portion of the text data (e.g., text data portion 261 with digital wave data portion 271; text data portion 262 with digital wave data portion 272; text data portion 263 with digital wave data portion 273.)

As such, the present invention enables subsequent access and retrieval of the stored data to be performed efficiently and conveniently because the text data can be used to search for a desired portion of digital wave data, and vice versa, since the text data and digital wave data is synchronized. In one embodiment, switch 135 is controlled based on phonetic group definitions of the text in the text data.

By performing real-time voice recognition on the voice input to generate text data, embodiments of the present invention eliminate the post-processing that is typically required in prior art systems in order to derive text data from stored voice data. Moreover, since the text data is generated directly from the voice input in the present invention and not from highly compressed voice data as in the prior art, high quality voice-to-text conversion is achieved. In addition, since the present invention does not rely on the stored voice data to generate the text data, the voice input can be subject to high compression and stored as digital wave data in accordance with the present invention to advantageously reduce the amount of memory required for storage without compromising the quality of the text data.

Figure 3:
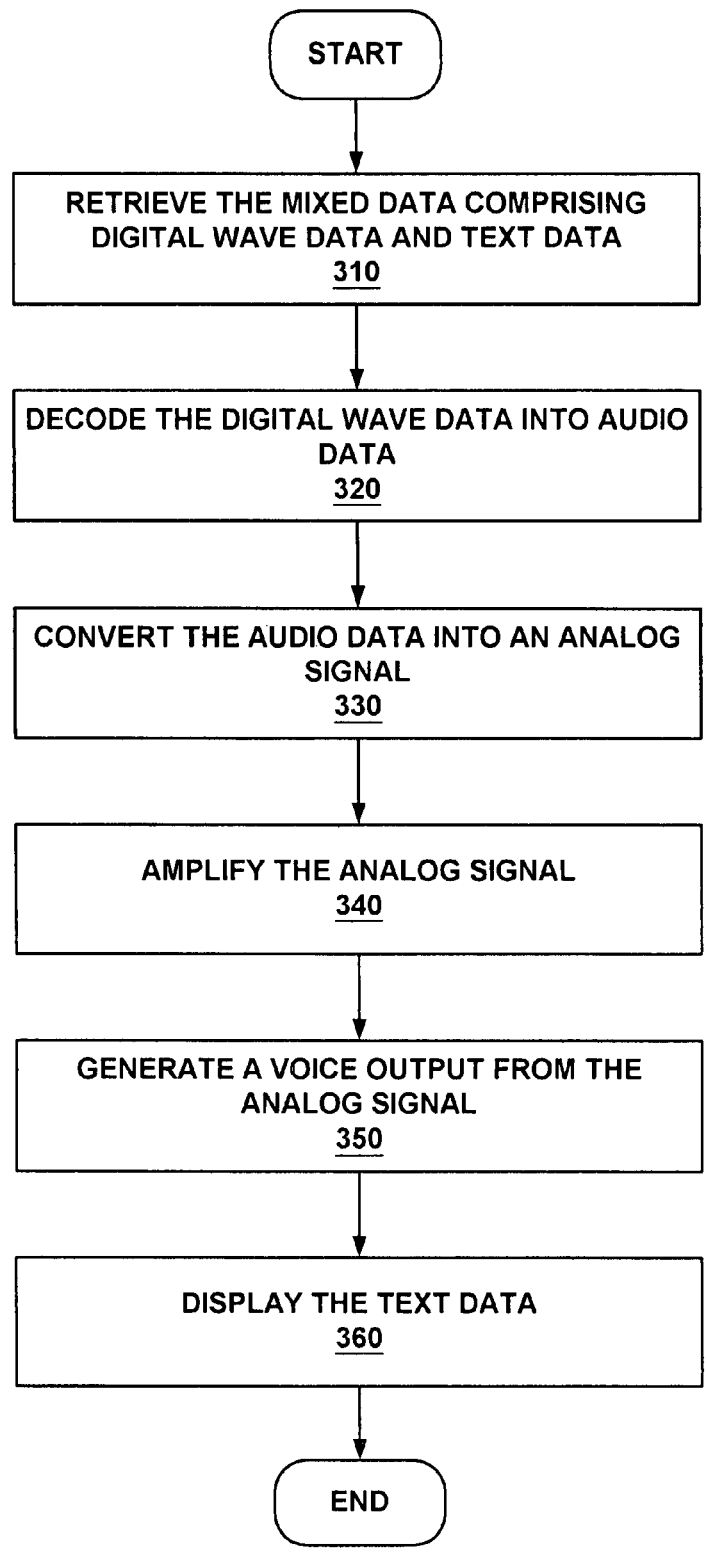
FIG. 3 is a flow diagram illustrating steps for performing playback using system 100 of FIG. 1 in accordance with one embodiment of the present invention.

With reference next to FIG. 3, a flow diagram 300 illustrating steps for performing playback using system 100 of FIG. 1 in accordance with one embodiment of the present invention is shown. In step 310, system 100 of FIG. 1 retrieves the mixed data which comprises digital wave data and text data from memory sub-system 140.

In step 320, system 100 of FIG. 1 decodes the digital wave data into audio data using decoder 150. In step 330, system 100 converts the audio data into an analog signal using D/A converter 160. In optional step 340, in one embodiment, system 100 amplifies the analog signal. In step 350, system 100 generates a voice output corresponding to the voice input from the analog signal.

It is appreciated that the present invention provides a high quality voice output. More specifically, the voice output is based on the recorded voice input (as digital wave data) and is a high fidelity reproduction thereof, and not based on a simulated voice generated using text data.

With reference still to FIG. 3, in step 360, system 100 of FIG. 1 displays the text data using display sub-system 180. More specifically, in one embodiment, the digital wave data and the text data retrieved is sent to decoder 150 and display sub-system 180 via switch 145 in alternate fashion such that output of the digital wave data by audio output device 170 and display of the text data by display sub-system 180 is synchronized. As such, the present invention affords great convenience to the reviewer of the recorded voice and text. In one embodiment, switch 145 is controlled based on phonetic group definitions of the text in the text data.

It is appreciated that embodiments of the present invention can operate for extended periods of time under battery power (e.g., disposable batteries, rechargeable batteries) because components of system 100 (FIG. 1) in accordance with the present invention do not consume power at a high rate. Thus, the present invention provides a digital recording and playback system which is operable under battery power and is portable and wherein high quality text data is generated from a voice input without requiring post-recording conversion.

Moreover, it is appreciated that system 100 of FIG. 1 in accordance with embodiments of the present invention does not require specialized circuit components or extensive retrofitting of existing computer systems and other appliances, because the circuit elements required for its implementation are commonly used in today's electronic appliances and are fully compatible with existing computer systems and other appliances. As such, a portable, battery-powered digital recording and playback system which does not require post-processing to generate high quality text data, and which is conducive to use with existing computer systems and other appliances is provided by the present invention.

It is further appreciated that although exemplary values and operational details (e.g., compression ratio of HCE 120, voice recognition techniques used in VRE 130) for various components are given with respect to embodiments of the present invention described above, such values and details are illustrative only and can vary within the scope and spirit of the present invention.

The preferred embodiment of the present invention, a digital recording and playback system with built-in voice recognition capability for concurrent text generation, is thus described. While the present invention has been described in particular embodiments, it should be appreciated that the present invention should not be construed as limited by such embodiments, but rather construed according to the below claims.

What is claimed is:

1. A system comprising:
   an encoder for encoding an audio signal to generate encoded audio data corresponding to said audio signal;
   a recognition engine for generating text data based on said audio signal, wherein said recognition engine is operable to generate said text data simultaneously with said generation of said encoded audio data by said encoder;
   a memory coupled to said encoder and said recognition engine, said memory for storing said encoded audio data and said text data; and
   a switch operable to output said encoded audio data and said text data to said memory in a synchronized manner based on said text data.

2. The system of claim 1, wherein said switch is operable to selectively couple said encoder and said recognition engine to said memory.

3. The system of claim 2, wherein said switch is further operable to decouple said recognition engine from said memory responsive to a coupling of said encoder to said memory, and wherein said switch is further operable to decouple said encoder from said memory responsive to a coupling of said recognition engine to said memory.

4. The system of claim 1, wherein said audio signal comprises a word, and wherein a portion of said text data associated with said word is grouped with a portion of said encoded audio data associated with said word.

5. The system of claim 1 further comprising:
   a decoder selectively coupled to said memory by a second switch, said decoder for decoding said encoded audio signal to generate decoded audio data;
   a digital-to-analog converter coupled to said decoder and for converting said decoded audio data into an analog audio signal;
   an amplifier coupled to said digital-to-analog converter and for generating an amplified audio signal based upon said analog audio signal; and
   an audio output device coupled to said amplifier and for generating an audio output from said amplified audio signal.

6. The system of claim 1 further comprising:
   a display device selectively coupled to said memory by a second switch, said display device for displaying said text data accessed from said memory.

7. The system of claim 1 further comprising:
   a component coupled to said memory and for enabling user-initiated editing of data associated with said audio signal.

8. The system of claim 1 further comprising:
   an audio capture device for sensing sound and generating said audio signal based upon said sound.

9. A method of storing data associated with an audio signal, said method comprising:
   encoding, using an encoder, using an audio signal to generate encoded audio data corresponding to said audio signal;
   generating, using a recognition engine, text data based on said audio signal, wherein said generating of said text data is performed simultaneously with said generation of said encoded audio data; and
   outputting, using a switch, said encoded audio data and said text data in a synchronized manner based on said text data.

10. The method of claim 9 further comprising:
    selectively coupling said encoder and said recognition engine to a memory.

11. The method of claim 10 further comprising:
    decoupling said recognition engine from said memory responsive to a coupling of said encoder to said memory; and
    decoupling said encoder from said memory responsive to a coupling of said recognition engine to said memory.

12. The method of claim 9, wherein said audio signal comprises a word, and wherein said method further comprises:
    grouping a portion of said text data associated with said word with a portion of said encoded audio data associated with said word.

13. The method of claim 9 further comprising:
    decoding said encoded audio signal to generate decoded audio data;
    converting said decoded audio data into an analog audio signal;
    generating an amplified audio signal based upon said analog audio signal; and
    generating an audio output from said amplified audio signal.

14. The method of claim 9 further comprising:
    accessing said text data; and
    displaying said accessed text data.

15. The method of claim 9 further comprising:
    enabling user-initiated editing of data associated with said audio signal.

16. A portable electronic device comprising:
    means for encoding an audio signal to generate encoded audio data corresponding to said audio signal;
    means for generating text data based on said audio signal, wherein said generating of said text data is performed simultaneously with said generation of said encoded audio data; and
    means for outputting said encoded audio data and said text data in a synchronized manner based on said text data, wherein said means for outputting comprises a switch.

17. The portable electronic device of claim 16 further comprising:
    means for selectively coupling said means for encoding and said means for generating text to said memory.

18. The portable electronic device of claim 17 further comprising:
    means for decoupling said means for generating text from said memory responsive to a coupling of said means for encoding to said memory; and
    means for decoupling said means for encoding from said memory responsive to a coupling of said means for generating text to said memory.

19. The portable electronic device of claim 16, wherein said audio signal comprises a word, and wherein said portable electronic device further comprises:

means for grouping a portion of said text data associated with said word with a portion of said encoded audio data associated with said word.

20. The portable electronic device of claim 16 further comprising:
   means for decoding said encoded audio signal to generate decoded audio data;
   means for converting said decoded audio data into an analog audio signal;
   means for generating an amplified audio signal based upon said analog audio signal; and
   means for generating an audio output from said amplified audio signal.

21. The portable electronic device of claim 16 further comprising:
   means for accessing said text data; and
   means for displaying said accessed text data.

22. The portable electronic device of claim 16 further comprising:
   means for enabling user-initiated editing of data associated with said audio signal.

* * * * *